(12) United States Patent
Xu et al.

(10) Patent No.: US 11,369,037 B1
(45) Date of Patent: Jun. 21, 2022

(54) APPARATUS, SYSTEM, AND METHOD FOR IMPROVING THE PERFORMANCE OF HARDWARE COMPONENTS UNDERGOING SERVICE IN OPEN CHASSIS DRAWERS

(71) Applicant: Meta Platforms, Inc., Menlo Park, CA (US)

(72) Inventors: Chenyu Xu, Hayward, CA (US); Jun Shen, Cupertino, CA (US); Madhavan Ravi, Fremont, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 0 days.

(21) Appl. No.: 17/167,471

(22) Filed: Feb. 4, 2021

(51) Int. Cl.
*H05K 7/20* (2006.01)
*H02G 11/00* (2006.01)

(52) U.S. Cl.
CPC ......... *H05K 7/20145* (2013.01); *H02G 11/00* (2013.01); *H05K 7/20736* (2013.01)

(58) Field of Classification Search
CPC ...... G06F 1/20; G06F 1/206; G06F 2200/201; G06F 1/181; G06F 1/187; H05K 7/20736; H05K 7/20145; H05K 7/20172; H05K 7/1487; H05K 7/1489; H05K 7/1421; H05K 7/1488; H05K 7/1491; H05K 7/18; G11B 33/142; G11B 33/128; G11B 33/122; G11B 33/08; H02G 11/00; F28D 9/0025; F28D 7/16; F28D 15/0233
USPC .............. 361/695, 679.48, 679.33, 688, 690, 361/679.02, 679.49, 727, 725, 826, 608, 361/679.32, 716, 704; 454/184; 165/104.33; 174/69, 99 R, 15.1, 99 E, 174/68.3, 72 A, DIG. 9
See application file for complete search history.

(56) References Cited

U.S. PATENT DOCUMENTS

2017/0290202 A1* 10/2017 Shah ..................... G06F 1/1632

* cited by examiner

*Primary Examiner* — Mandeep S Buttar
(74) *Attorney, Agent, or Firm* — FisherBroyles, LLP (57) ABSTRACT

A disclosed system includes (1) at least one hardware component mounted to a drawer of a chassis, (2) a fan module capable of generating airflow to cool the hardware component, and (3) an extensible airduct coupled between the hardware component and the fan module such that, when the drawer of the chassis is opened, the extensible airduct stretches out to lengthen a distance between the hardware component and the fan module and, when the drawer of the chassis is closed, the extensible airduct contracts to shorten the distance between the hardware component and the fan module. Various other apparatuses, systems, and methods are also disclosed.

20 Claims, 8 Drawing Sheets

APPARATUS, SYSTEM, AND METHOD FOR IMPROVING THE PERFORMANCE OF HARDWARE COMPONENTS UNDERGOING SERVICE IN OPEN CHASSIS DRAWERS

BRIEF DESCRIPTION OF DRAWINGS AND APPENDIX

The accompanying Drawings illustrate a number of exemplary embodiments and are parts of the specification. Together with the following description, the Drawings demonstrate and explain various principles of the instant disclosure.

While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, combinations, equivalents, and alternatives falling within this disclosure.

DETAILED DESCRIPTION OF EXEMPLARY EMBODIMENTS

The present disclosure is generally directed to apparatuses, systems, and methods for improving the performance of hardware components undergoing service in open chassis drawers. As will be explained in greater detail below, these apparatuses, systems, and methods may provide numerous features, benefits, and/or advantages.

Certain hardware components (such as hard disk drives) may generate heat during operation and/or be susceptible or vulnerable to overheating. For example, hard disk drives (sometimes referred to as "HDDs") may overheat during operation if not properly cooled and/or treated. Such overheating may cause and/or lead to poor performance, malfunctions (e.g., misreads and/or miswrites), data loss, and/or permanent failures (e.g., head crashes). To prevent and/or mitigate overheating issues, hard disk drives may be cooled by and/or treated with fan modules that generate airflow.

Unfortunately, such fan modules may introduce acoustic vibrations and/or interference capable of disturbing the data tracking operations of the corresponding hard disk drives. For example, hard disk drives may operate by storing and/or accessing data on tracks and/or grooves on spinning disks. To read and/or write data on such spinning disks, the hard disk drives may each implement and/or control a head attached to an actuator arm. This actuator arm may control and/or move the head position via a voice coil and/or smaller piezoelectric micro-actuators. In this way, the actuator arm may position the head over the correct track and/or groove to facilitate reading and/or writing data.

The mechanical nature of these data tracking operations may leave the hard disk drives susceptible and/or vulnerable to positional tracking errors caused at least in part by the acoustic vibrations from the fan modules. If such positional tracking errors are too high, the hard disk drives may experience and/or suffer performance degradation. In some examples, the hard disk drives may be incorporated and/or mounted into the drawers of a chassis. In such examples, the fan modules generating airflow for the hard disk drives may ramp up their speeds for cooling purposes when those drawers are opened for service. Such ramped-up speeds may introduce unacceptable levels of acoustic vibrations that lead to performance degradation in the hard disk drives.

The instant disclosure, therefore, identifies and addresses a need for additional apparatuses, systems, and methods for improving the performance of hardware components undergoing service in open chassis drawers. As will be described in greater detail below, an extensible airduct may be incorporated between a fan module and one or more hard disk drives mounted to a drawer of a chassis. In some embodiments, the extensible airduct may stretch out as the drawer is opened, thereby lengthening the distance between the hard disk drives and the fan module. This increase in the distance between the hard disk drives and the fan module may be able to greatly reduce and/or mitigate the level of acoustic vibrations that reach the hard disk drives from the fan module when the drawer is opened for service. In addition, the extensible airduct may support and/or facilitate this increase in distance without sacrificing and/or negatively impacting the storage density and/or Total Cost of Ownership (TCO) wins of the HDD-based solution.

The following will provide, with reference to FIGS. 1-7, detailed descriptions of various apparatuses, systems, components, and/or implementations for improving the performance of hardware components undergoing service in open chassis drawers. The discussion corresponding to FIG. 8 will provide detailed descriptions of an exemplary method for improving the performance of hardware components undergoing service in open chassis drawers.

Figure 1:
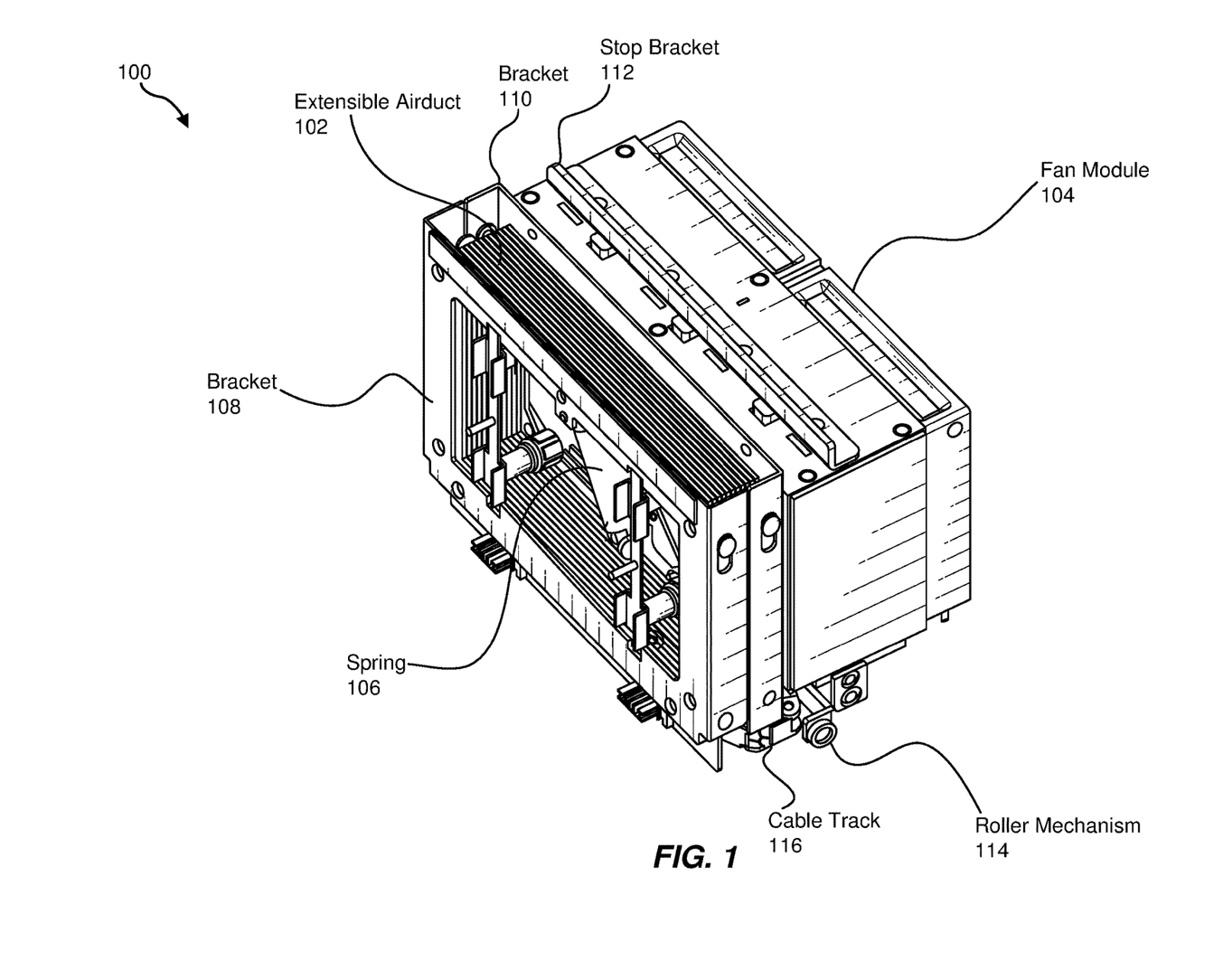
FIG. 1 is an illustration of an exemplary apparatus for improving the performance of hardware components undergoing service in open chassis drawers according to one or more embodiments of this disclosure.

FIG. 1 illustrates an apparatus 100 for improving the performance of hardware components undergoing service in open chassis drawers. As illustrated in FIG. 1, exemplary apparatus 100 may include and/or represent a fan module 104 and/or an extensible airduct 102. The illustration of apparatus 100 in FIG. 1 may represent and/or correspond to a position, configuration, and/or arrangement in which extensible airduct 102 is contracted and/or compressed.

In some examples, fan module 104 may be capable of generating airflow to cool one or more hardware components (e.g., hard disk drives). In such examples, extensible airduct 102 may stretch out and/or expand to lengthen the distance between such hardware components and fan module 104 in certain scenarios (e.g., during service). Additionally or alternatively, extensible airduct 102 may contract and/or be compressed to shorten the distance between such hardware components and fan module 104 in other scenarios (e.g., during normal operation).

Extensible airduct 102 may include and/or form one or more expansion and/or contraction features. In some examples, extensible airduct 102 may include and/or represent an accordion-like and/or bellows-like tunnel or channel that directs airflow from one side to another. In such examples, extensible airduct 102 may include and/or incorporate one or more creases, crimps, bellows, and/or accordion-like mechanisms formed within at least one of the sides. For example, extensible airduct 102 may include and/or incorporate flex creases formed into opposing sides and/or encompassing the tunnel and/or channel. In this example, the flex creases may enable extensible airduct to flex, bend, expand, extend, compress, and/or contract to accommodate lengthening and/or shortening extensible airduct 102.

Extensible airduct 102 may include and/or form any suitable shape. In some examples, extensible airduct 102 may include and/or form a tunnel and/or channel shaped as a square, a circle, an oval, and/or a rectangle (e.g., a non-square rectangle). Additional examples of shapes formed by extensible airduct 102 include, without limitation, triangles, pentagons, hexagons, octagons, ovals, diamonds, parallelograms, combinations or variations of one or more of the same, and/or any other suitable shapes.

In addition, extensible airduct 102 may be of any suitable dimensions. In one example, extensible airduct 102 may expand and/or extend to form a relatively long tunnel and/or channel between fan module 104 and one or more hardware components mounted to an open drawer. In this example, extensible airduct 102 may also contract and/or be compressed to form a relatively short tunnel and/or channel between fan module 104 and one or more hardware components mounted to a closed drawer.

Extensible airduct 102 may include and/or represent a set of borders and/or sides dimensioned to substantially surround the tunnel and/or channel. In one example, such borders and/or sides may include and/or represent an inner portion of material designed and/or intended for placement between fan module 104 and a drawer holding one or more hardware components.

Extensible airduct 102 may include and/or contain any of a variety of materials. Examples of such materials include, without limitation, metals, foams, ceramics, plastics, injection molding materials, polymers, papers, woods, composites, variations or combinations of one or more of the same, and/or any other suitable materials.

Fan module 104 may include and/or represent one or more fans, blades, blowers, and/or impellers capable of generating airflow for cooling purposes. In some examples, fan module 104 may achieve and/or support airflow generation via rotating fans and/or blades. In such examples, fan module 104 may employ and/or implement axial flow, centrifugal flow, and/or impeller flow. Fan module 104 may include and/or incorporate one or more supply and/or return vents or openings that support ventilation for the purpose of airflow generation.

Fan module 104 may include and/or form any suitable shape and/or dimensions. In some examples, fan module 104 may form and/or be shaped as a square, a circle, an oval, and/or a rectangle (e.g., a non-square rectangle). Additional examples of shapes formed by fan module 104 include, without limitation, triangles, pentagons, hexagons, octagons, ovals, diamonds, parallelograms, combinations or variations of one or more of the same, and/or any other suitable shapes. In one example, fan module 104 may form any shape and/or dimensions that conform to and/or fit within a drawer and/or a slot of a chassis that houses the drawer.

Fan module 104 may include and/or contain any of a variety of materials. Examples of such materials include, without limitation, metals, foams, ceramics, plastics, injection molding materials, polymers, papers, woods, composites, variations or combinations of one or more of the same, and/or any other suitable materials.

In some examples, exemplary apparatus 100 may also include and/or represent a spring 106, a bracket 108, a bracket 110, a stop bracket 112, a roller mechanism 114, and/or a cable track 116. In one example, spring 106 may be coupled and/or attached between fan module 104 and one or more hardware components mounted to a drawer of a chassis. In other words, one side of spring 106 may be coupled and/or attached to fan module 104 and/or a feature located on that side of extensible airduct 102, and another side of spring 106 may be coupled and/or attached to a feature located on the side of the drawer. For example, the other side of spring 106 may be coupled and/or attached to the drawer holding the hardware components. In this example, spring 106 may apply and/or provide a force and/or pressure that causes extensible airduct 102 to stretch out and/or expand as the drawer of the chassis is opened.

In some examples, spring 106 may reside, sit, and/or be installed within or inside extensible airduct 102. Additionally or alternatively, spring 106 may provide the necessary compression, force, and/or load to facilitate expanding extensible airduct 102 as the drawer of the chassis is opened.

Spring 106 may include and/or represent any type or form of mechanical apparatus and/or device that stores and/or releases energy or force. In one example, spring 106 may include and/or represent a gas spring. Additional examples of spring 106 include, without limitation, compression springs, tension springs, extension springs, torsion springs, constant-force springs, combinations or variations of one or more of the same, and/or any other suitable springs.

Spring 106 may be of any suitable sizes, dimensions, and/or shapes. In one example, spring 106 may be sized in a particular way to fit properly within extensible airduct 102. Additionally or alternatively, spring 106 may be sized in a particular way to force the expansion of extensible airduct 102 to a certain length and/or distance. As an example, the distance to which extensible airduct 102 is expanded by spring 106 may facilitate and/or support sufficient airflow and cooling from fan module 104 to the hardware components mounted to the drawer of the chassis. However, the distance to which extensible airduct 102 is expanded by spring 106 may fail to facilitate and/or support sufficient acoustic vibrations from fan module 104 to the hardware components mounted to the drawer of the chassis.

Spring 106 may include and/or contain a variety of materials. Examples of such materials include, without limitation, metals, foams, ceramics, plastics, injection molding materials, polymers, papers, woods, composites, alloys, gases, combinations or variations of one or more of the same, and/or any other suitable materials.

In some examples, bracket 108 may be coupled and/or attached between extensible airduct 102 and one or more hardware components mounted to a drawer of a chassis. In such examples, one side of bracket 108 may be coupled and/or attached to extensible airduct 102, and another side of bracket 108 may be coupled and/or attached to a feature of the drawer.

In some examples, bracket 110 may be coupled and/or attached between extensible airduct 102 and fan module 104. In such examples, one side of bracket 110 may be coupled and/or attached to extensible airduct 102, and another side of bracket 110 may be coupled and/or attached to fan module 104. In one example, bracket 108 and bracket 110 may make physical contact with one another to limit the contraction and/or compression of extensible airduct 102 as the drawer is closed.

In some examples, stop bracket 112 may be coupled and/or attached to at least one side of fan module 104. In one example, stop bracket 112 may make contact with a chassis that houses the drawer to which the hardware components are mounted. For example, as the drawer is closed, stop bracket 112 may make physical contact with an area or portion of the chassis located toward the rear of a slot that houses the drawer. This physical contact between stop bracket 112 and the chassis may cause fan module 104 to stop at the rear of the slot and/or cause extensible airduct 102 to contract and/or compress due at least in part to fan module 104 having been stopped there.

Bracket 108, bracket 110, and/or stop bracket 112 may be of any suitable sizes, dimensions, and/or shapes. In one example, bracket 108 and/or bracket 110 may be sized in a particular way to at least partially encompass, surround, and/or protect extensible airduct 102 when contracted and/or compressed. Additionally or alternatively, bracket 108 may be sized and/or dimensioned in a particular way to facilitate interfacing extensible airduct 102 and the drawer holding the hardware components with one another. Similarly, bracket 110 may be sized and/or dimensioned in a particular way to facilitate interfacing extensible airduct 102 and fan module 104 with one another. Stop bracket 112 may be sized and/or dimensioned in a particular way to facilitate stopping fan module 104 upon impact against the chassis in which the drawer is installed.

Bracket 108, bracket 110, and/or stop bracket 112 may include and/or contain a variety of materials. Examples of such materials include, without limitation, metals, foams, ceramics, plastics, injection molding materials, polymers, papers, woods, composites, alloys, combinations or variations of one or more of the same, and/or any other suitable materials.

In some examples, roller mechanism 114 may be coupled and/or attached to at least one side of fan module 104. In one example, roller mechanism 114 may enable fan module 104 to roll and/or slide across the slot of the chassis that houses the drawer. For example, as the drawer is opened, fan module 104 may roll and/or slide across the slot by way of roller mechanism 114. In this example, roller mechanism 114 may include and/or represent one or more wheels, rollers, and/or sliders that facilitate a rolling and/or sliding movement.

Roller mechanism 114 may be of any suitable sizes, dimensions, and/or shapes. In one example, roller mechanism 114 may be sized in a particular way to properly support and/or move fan module 104 and/or extensible airduct 102 as the drawer is opened. Roller mechanism 114 may include and/or contain a variety of materials. Examples of such materials include, without limitation, metals, foams, ceramics, plastics, injection molding materials, polymers, papers, woods, composites, alloys, combinations or variations of one or more of the same, and/or any other suitable materials.

In some examples, cable track 116 may serve and/or function as a flexible conduit for one or more electrical wires associated with fan module 104 and/or one or more of the hardware components mounted to the drawer. In one example, cable track 116 may move along and/or consistent with the expansion and/or contraction of extensible airduct 102. In other words, cable track 116 may follow and/or track the expansion and/or contraction of extensible airduct 102. For example, cable track 116 may expand and/or lengthen along one direction and/or plane as the drawer to which the hardware components are mounted opens from the chassis. In this example, cable track 116 may contract and/or shorten along that direction and/or plane as the drawer to which the hardware components are mounted closes to the chassis.

Cable track 116 may be of any suitable sizes, dimensions, and/or shapes. In one example, cable track 116 may be sized in a particular way to at least partially encompass, surround, and/or protect electrical wiring and/or cables when contracted or expanded. In this example, cable track 116 may reside, sit, and/or be installed between extensible airduct 102 and a slot of the chassis in which the drawer is housed. Additionally or alternatively, cable track 116 may reside, sit, and/or be installed between roller mechanism 114 and the hardware components mounted to the drawer.

Cable track 116 may include and/or contain a variety of materials. Examples of such materials include, without limitation, metals, foams, ceramics, plastics, injection molding materials, polymers, papers, woods, composites, alloys, combinations or variations of one or more of the same, and/or any other suitable materials.

Figure 2:
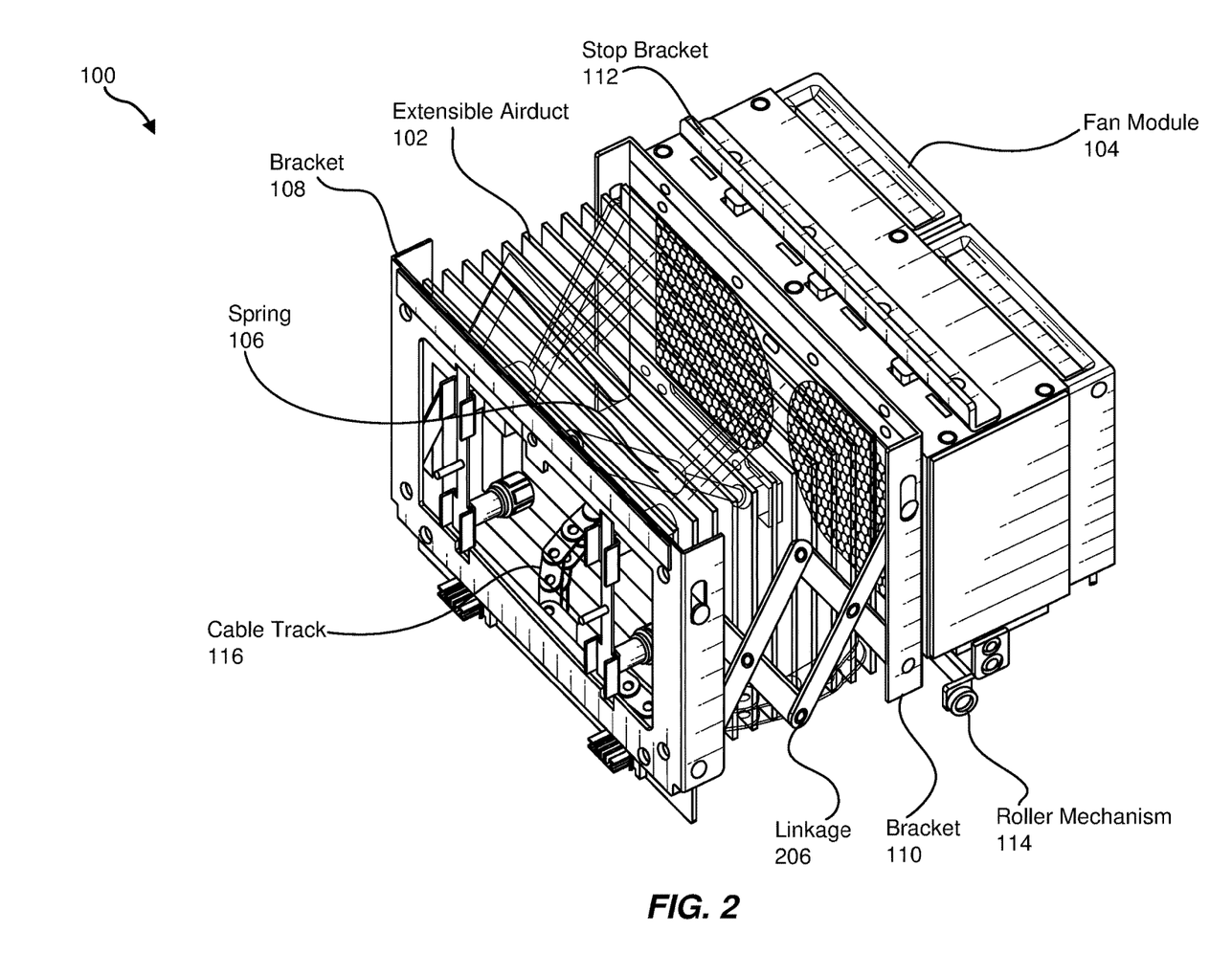
FIG. 2 is an illustration of an additional exemplary apparatus for improving the performance of hardware components undergoing service in open chassis drawers according to one or more embodiments of this disclosure.

FIG. 2 illustrates an exemplary implementation of apparatus 100 for improving the performance of hardware components undergoing service in open chassis drawers. In some examples, the various elements and/or features of apparatus 100 in FIG. 2 may operate and/or function in any of the different ways described above in connection with FIG. 1. The illustration of apparatus 100 in FIG. 2 may represent and/or correspond to a position, configuration, and/or arrangement in which extensible airduct 102 is expanded and/or extended. This position, configuration, and/or arrangement of extensible airduct 102 in FIG. 2 may result from and/or correspond to an open chassis drawer. In contrast, the position, configuration, and/or arrangement of extensible airduct 102 in FIG. 1 may result from and/or correspond to a closed chassis drawer.

As illustrated in FIG. 2, apparatus 100 may include and/or represent one or more linkages, such as linkage 206. In some examples, linkage 206 may be coupled and/or attached between fan module 104 and/or the chassis drawer. In one example, one side of linkage 206 may be coupled and/or attached to bracket 108, and another side of linkage 206 may be coupled and/or attached to bracket 110. Additionally or alternatively, linkage 206 may support the stretching out and/or expansion of extensible airduct 102 as the chassis drawer changes from closed to opened and/or while the chassis drawer remains opened.

Linkage 206 may include and/or form one or more expansion and/or contraction features. In some examples, linkage 206 may include and/or represent an accordion-like and/or telescoping mechanism. In such examples, linkage 206 may expand and/or extend with extensible airduct 102 as the chassis drawer is opened. Additionally or alternatively, linkage 206 may contract and/or be compressed with extensible airduct 102 as the chassis drawer is closed.

Linkage 206 may be of any suitable sizes, dimensions, and/or shapes. In one example, linkage 206 may be sized in a particular way to support extensible airduct 102 as it is expanded or contracted with the chassis drawer's opening or closing. In this example, linkage 206 may reside, sit, and/or be installed between fan module 104 and the drawer.

Linkage 206 may include and/or contain a variety of materials. Examples of such materials include, without limitation, metals, ceramics, plastics, injection molding materials, polymers, composites, alloys, combinations or variations of one or more of the same, and/or any other suitable materials.

Figure 3:
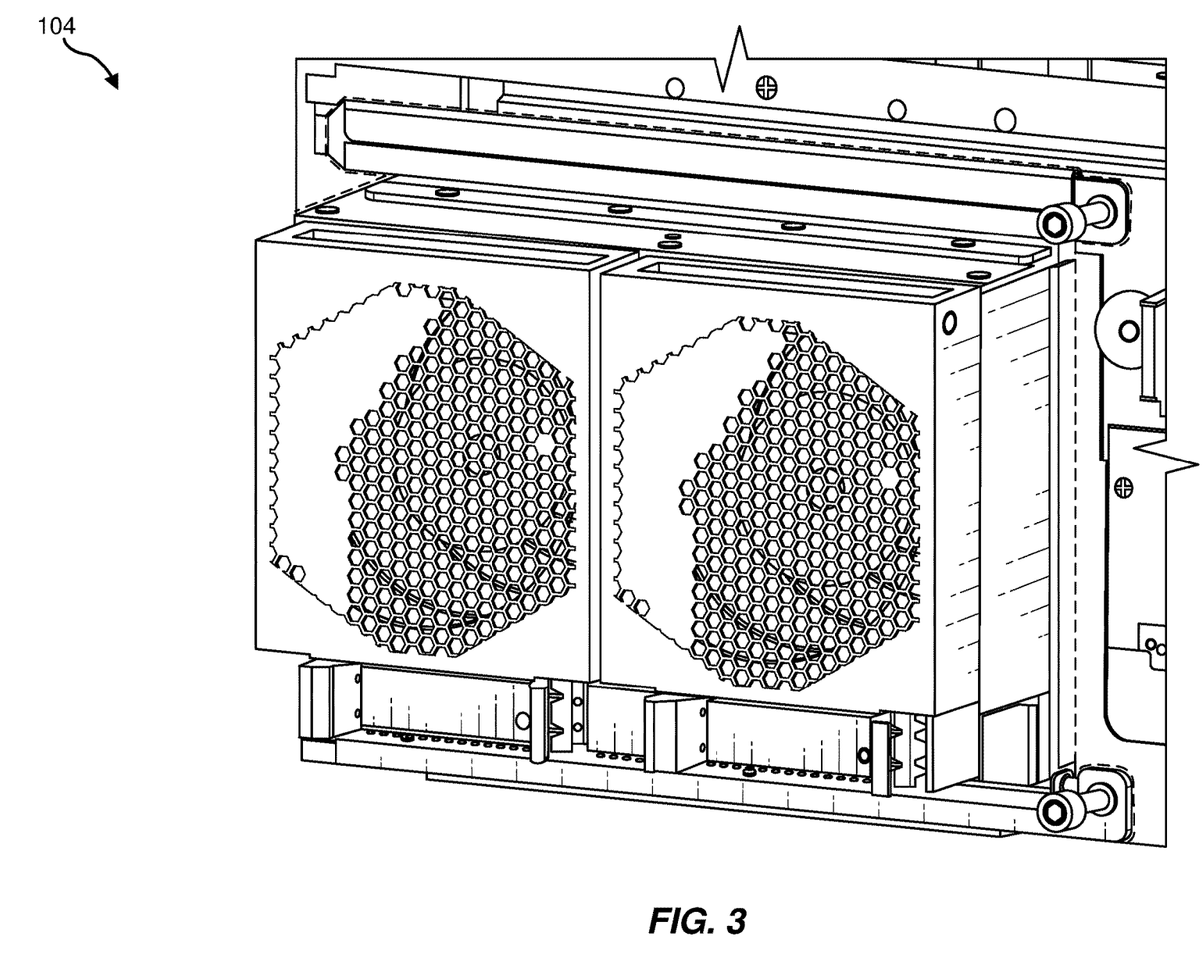
FIG. 3 is an illustration of an exemplary fan module capable of generating airflow to cool certain hardware components according to one or more embodiments of this disclosure.

FIG. 3 illustrates an exemplary implementation of fan module 104 incorporated into apparatus 100. In some examples, the various elements and/or features of fan module 104 in FIG. 3 may operate and/or function in any of the different ways described above in connection with FIGS. 1 and 2. As illustrated in FIG. 3, fan module 104 may include and/or incorporate one or more vents or openings that support ventilation for the purpose of generating airflow. In some examples, the airflow generated by fan module 104 may be directed away from one or more of hardware components mounted to a drawer of a chassis. For example, fan module 104 may suck, pull, and/or exhaust heat emitted by one or more hardware components mounted to the drawer of the chassis. By doing so, fan module 104 may be able to effectively cool such hardware components.

Figure 4:
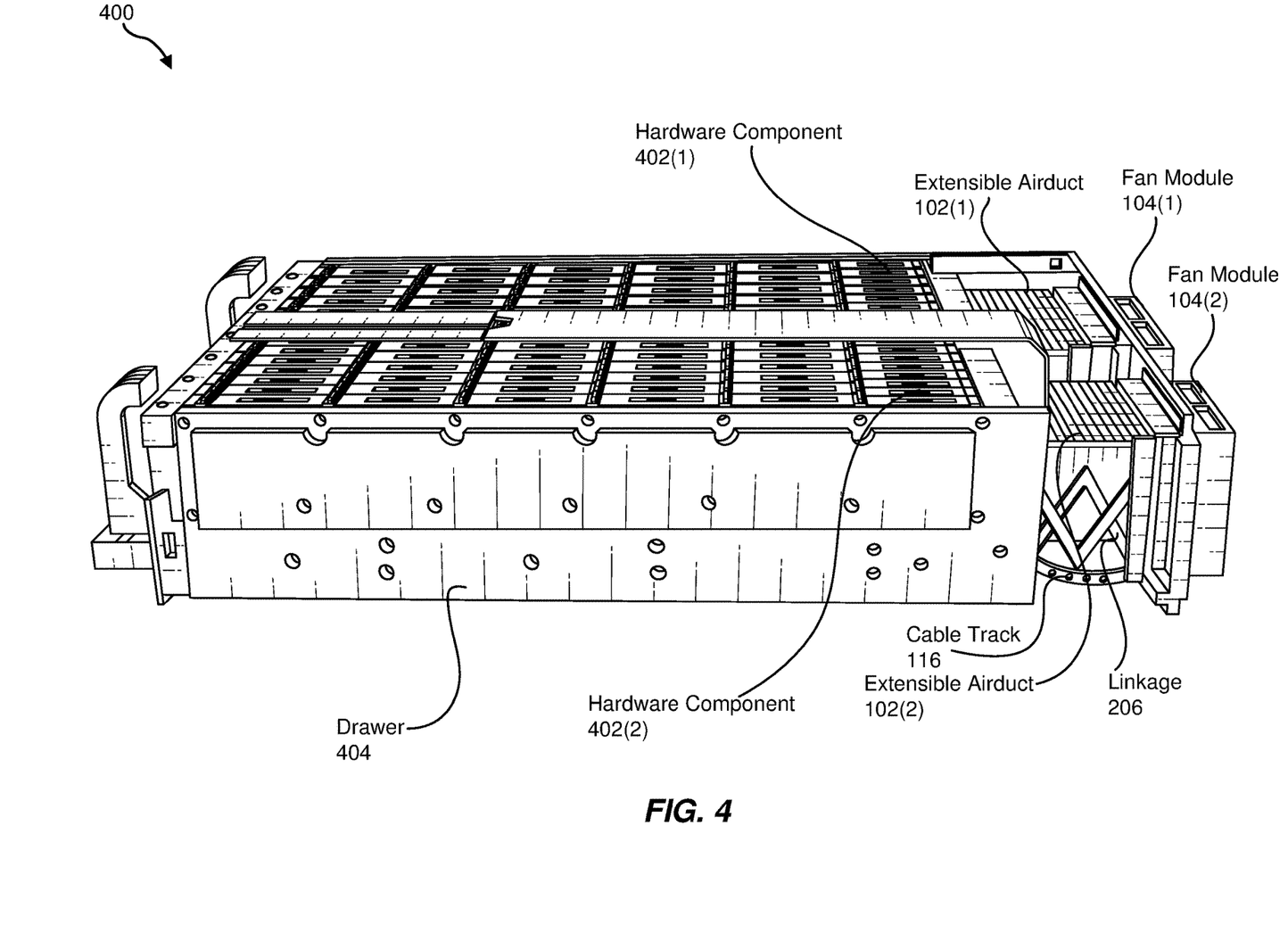
FIG. 4 is an illustration of an exemplary system for improving the performance of hardware components undergoing service in open chassis drawers according to one or more embodiments of this disclosure.

FIG. 4 illustrates an exemplary system 400 for improving the performance of hardware components undergoing service in open chassis drawers. In some examples, the various elements and/or features of exemplary system 400 in FIG. 4 may operate and/or function in any of the different ways described above in connection with FIGS. 1-3. As illustrated in FIG. 4, exemplary system 400 may include and/or represent fan modules 104(1) and 104(2), extensible airducts 102(1) and 102(2), hardware components 402(1) and 402(2), cable track 116, linkage 206, and a drawer 404.

In one example, hardware components 402(1) and 402(2) may be mounted to drawer 404. In this example, extensible airducts 102(1) and 102(2) may be coupled and/or attached between hardware components 402(1) and 402(2) and fan modules 104(1) and 104(2), respectively. For example, one side of extensible airducts 102(1) and 102(2) may be coupled and/or attached to fan modules 104(1) and 104(2), and another side of extensible airducts 102(1) and 102(2) may be coupled and/or attached to drawer 404.

In one example, fan modules 104(1) and 104(2) may generate airflow that passes and/or travels to hardware components 402(1) and 402(2), respectively. In this example, the airflow may serve to cool hardware components 402(1) and 402(2) and/or to regulate their temperatures.

In some examples, cable track 116 and linkage 206 may follow and/or track the expansion and/or contraction of extensible airducts 102(1) and 102(2). Accordingly, as drawer 404 is opened, cable track 116 and linkage 206 may stretch out and/or expand to lengthen consistent and/or along with extensible airducts 102(1) and 102(2).

Figure 5:
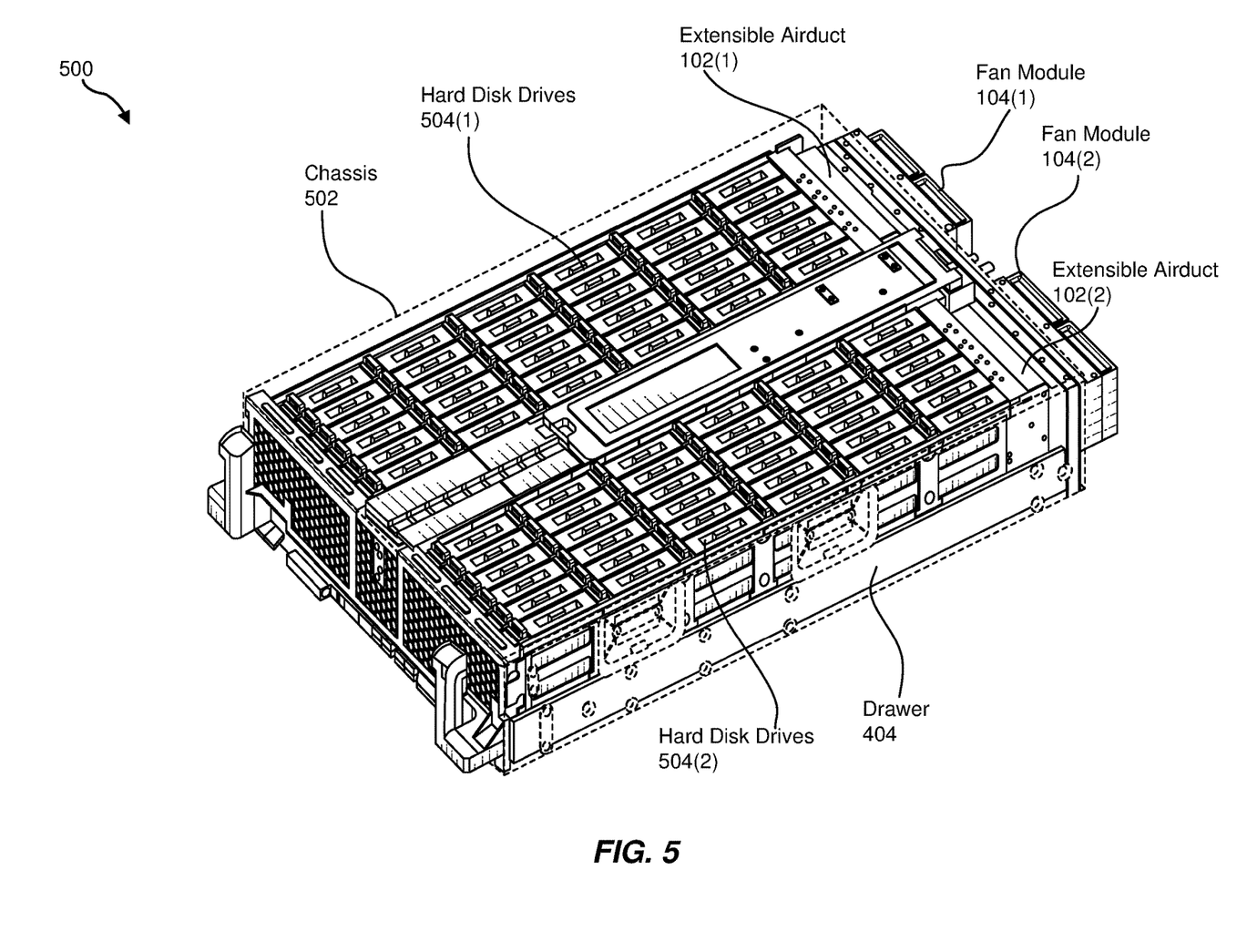
FIG. 5 is an illustration of an additional exemplary system for improving the performance of hardware components undergoing service in open chassis drawers according to one or more embodiments of this disclosure.
Figure 6:
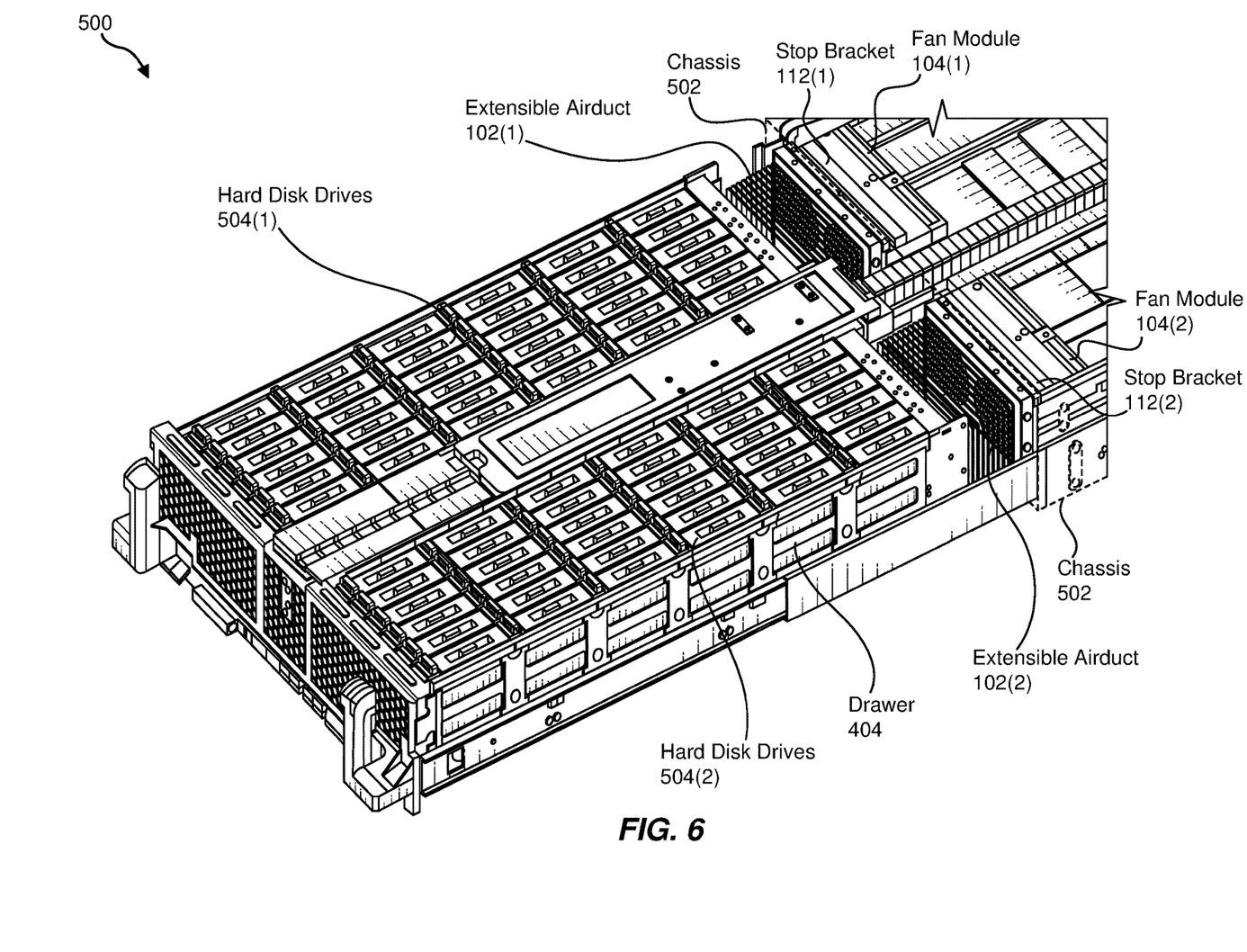
FIG. 6 is an illustration of an additional exemplary system for improving the performance of hardware components undergoing service in open chassis drawers according to one or more embodiments of this disclosure.
Figure 7:
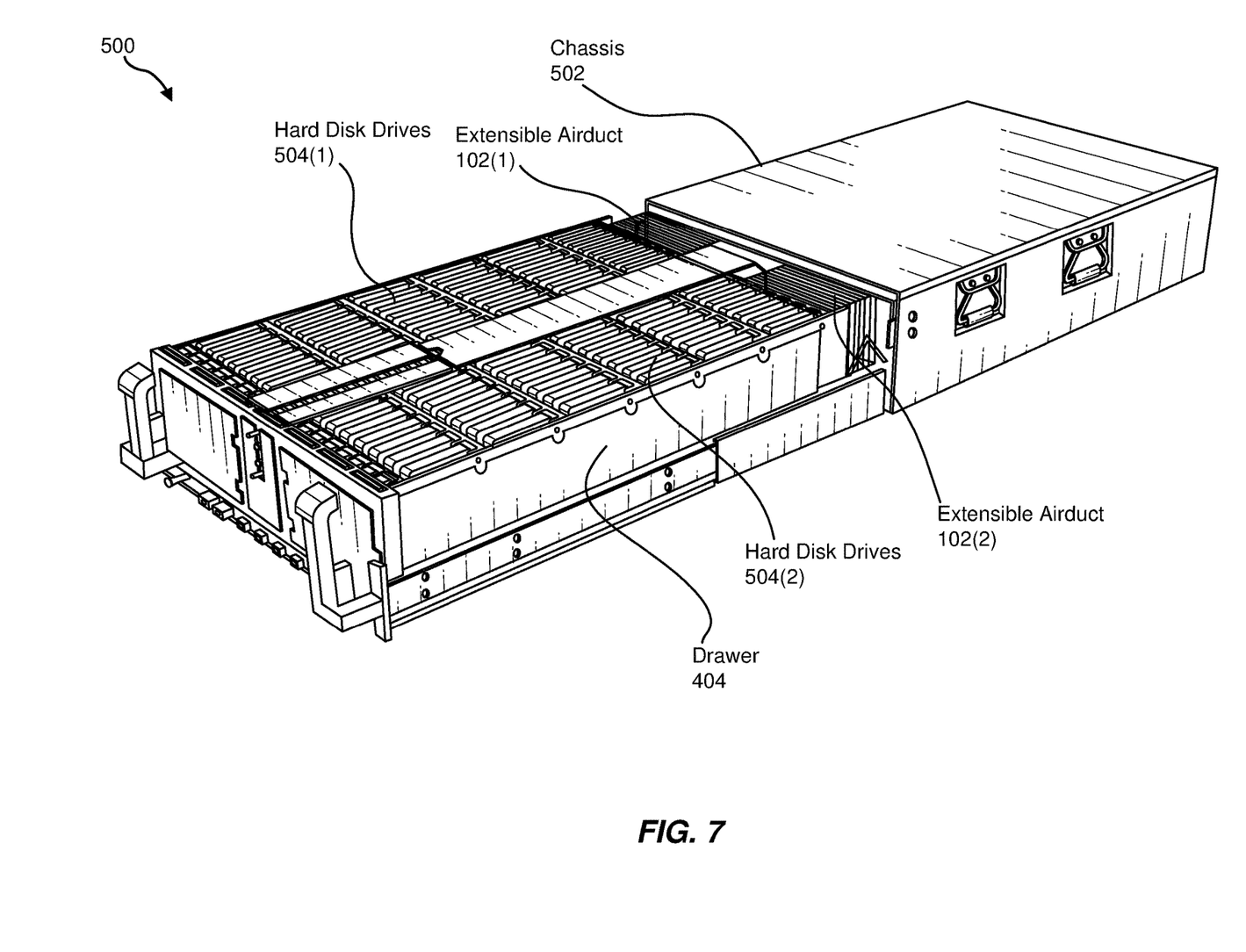
FIG. 7 is an illustration of an additional exemplary system for improving the performance of hardware components undergoing service in open chassis drawers according to one or more embodiments of this disclosure.

FIGS. 5-7 illustrate an exemplary system 500 for improving the performance of hardware components undergoing service in open chassis drawers. In some examples, exemplary system 500 may include and/or represent a storage server, a Redundant Array of Inexpensive Disks (RAID), and/or Just a Bunch of Disks (JBOD). As illustrated in FIGS. 5-7, exemplary system 500 may include and/or represent fan modules 104(1) and 104(2), extensible airducts 102(1) and 102(2), hard disk drives 504(1) and 504(2), drawer 404, and a chassis 502. In one example, hard disk drives 504(1) and 504(2) may be mounted to drawer 404. In this example, extensible airducts 102(1) and 102(2) may be coupled and/or attached between hard disk drives 504(1) and 504(2) and fan modules 104(1) and 104(2), respectively.

In some examples, drawer 404 may be installed and/or inserted into a slot of chassis 502. In one example, drawer 404 may be opened from and/or closed in the slot of chassis 502. As drawer 404 is opened, extensible airducts 102(1) and 102(2) may stretch out and/or expand to lengthen the distance between fan modules 104(1) and 104(2) and hard disk drives 504(1) and 504(2), respectively, during service. In this example, fan modules 104(1) and 104(2) may roll and/or slide across the slot of chassis 502 until reaching the front of the slot.

At that point, drawer 404 may reach the end of its sliding rails and/or engage the stopping points on those sliding rails, thereby causing fan modules 104(1) and 104(2) to stop before exiting the front side of the slot. These sliding rails may control the extent to which drawer 404 is able to be pulled out of the chassis. In some examples, such sliding rails may ensure the roller contact with the chassis when drawer 404 is open. Additionally or alternatively, fan modules 104(1) and 104(2) may remain inside the slot of chassis 502 while drawer 404 is open and/or hard disk drives 504(1) and 504(2) are undergoing service by an administrator and/or technician.

Inversely, as drawer 404 is closed, extensible airducts 102(1) and 102(2) may contract and/or be compressed to shorten the distance between fan modules 104(1) and 104(2) and hard disk drives 504(1) and 504(2), respectively, to return to normal operation. In this example, fan modules 104(1) and 104(2) may roll and/or slide across the slot of chassis 502 until reaching the back of the slot. At that point, stop brackets 112(1) and 112(2) may engage a back area of chassis 502, thereby causing fan modules 104(1) and 104(2) to stop before exiting the back side of the slot. In one embodiment, a portion of fan modules 104(1) and 104(2) may project and/or jut out of one or more openings formed at the back area of the slot of chassis 502 while drawer 404 is closed and/or hard disk drives 504(1) and 504(2) are operating under normal circumstances or conditions.

In some examples, fan modules 104(1) and 104(2) may generate airflow that passes and/or travels to hard disk drives 504(1) and 504(2), respectively. In such examples, the airflow may serve to cool hard disk drives 504(1) and 504(2) and/or to regulate their temperatures. In one example, the rotational speed of fan modules 104(1) and 104(2) may ramp up and/or increase as drawer 404 is opened and/or while drawer 404 remains open for service. In this example, the ramped-up rotational speed may effectively increase the amount of airflow generated by fan modules 104(1) and 104(2).

In one example, the rotational speed of fan modules 104(1) and 104(2) may ramp down and/or decrease as drawer 404 is closed and/or while drawer 404 remains closed for normal operation of hard disk drives 504(1) and 504(2). In this example, the ramped-down rotational speed may effectively decrease the amount of airflow generated by fan modules 104(1) and 104(2).

Figure 8:
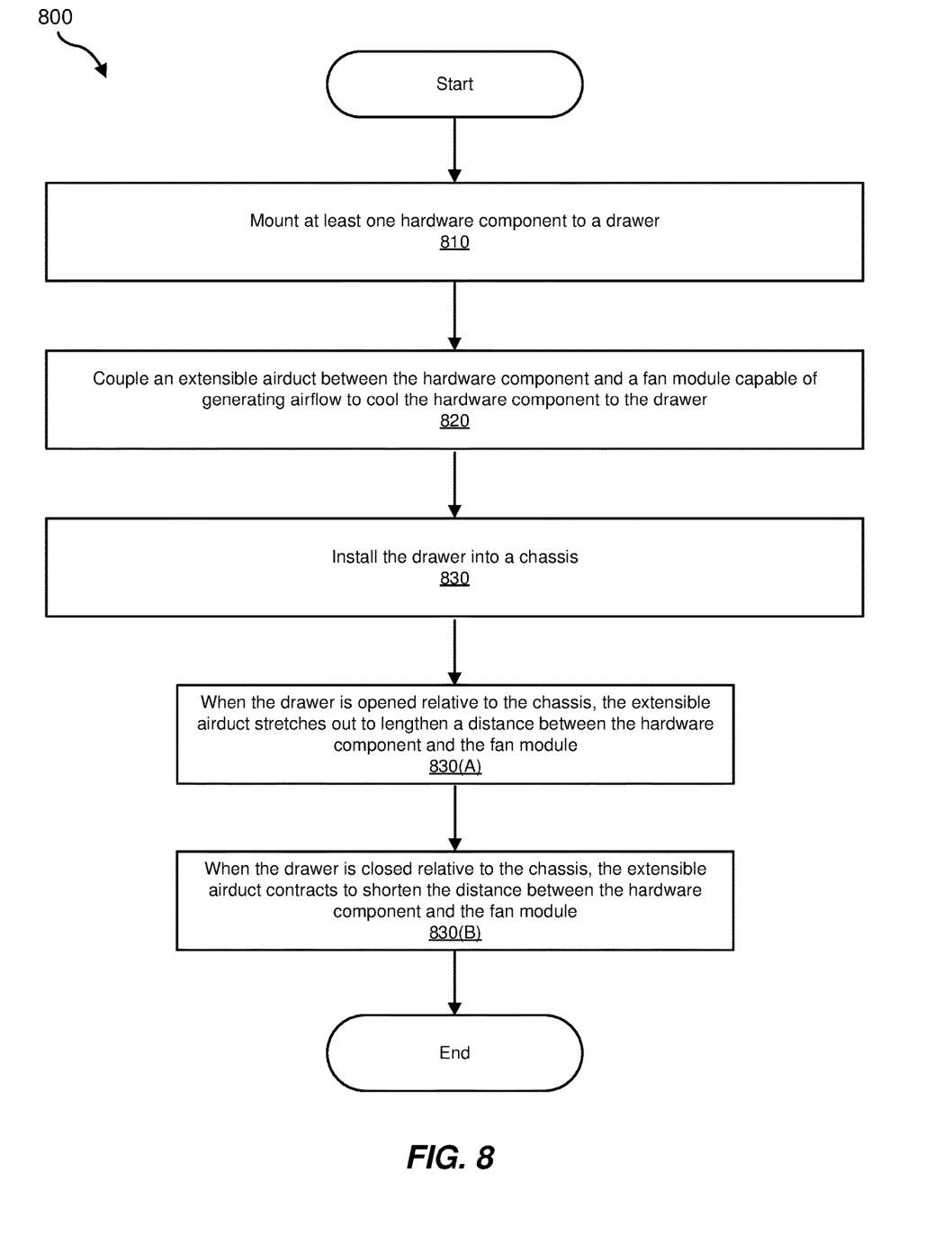
FIG. 8 is a flowchart of an exemplary method for improving the performance of hardware components undergoing service in open chassis drawers.

FIG. 8 is a flow diagram of an exemplary method 800 for improving the performance of hardware components undergoing service in open chassis drawers. The steps shown in FIG. 8 may be performed as part of a process for manufacturing and/or assembling a system or apparatus that facilitates improving the performance of hardware components undergoing service in open chassis drawers. Additionally or alternatively, the steps shown in FIG. 8 may also incorporate and/or involve various sub-steps and/or variations consistent with the descriptions provided above in connection with FIGS. 1-7.

As illustrated in FIG. 8, method 800 may include a step 810 in which at least one hardware component is mounted to a drawer. In one example, a computing equipment manufacturer or administrator may mount, attach, and/or couple a hardware component to a drawer. For example, the computing equipment manufacturer or administrator may mount a set of hard disk drives to the drawer. In this example, this drawer may be fitted to and/or designed for a slot of a storage server chassis and/or JBOD.

As illustrated in FIG. 8, method 800 may also include a step 820 in which an extensible airduct is coupled between the hardware component and a fan module capable of generating airflow to cool the hardware component mounted to the drawer. In one example, the computing equipment manufacturer or administrator may mount, attach, and/or couple an extensible airduct between the hardware component and a fan module. For example, the computing equipment manufacturer or administrator may physically couple the extensible airduct between the set of hard disk drives and the fan module. More specifically, the computer equipment manufacturer or administrator may attach one side of the extensible airduct to the fan module and another side of the extensible airduct to the drawer holding the hard disk drives. In this example, the fan module may be designed and/or intended to generate airflow to cool the set of hard disk drives mounted to the drawer.

As illustrated in FIG. 8, method 800 may also include a step 830 in which the drawer is installed into a chassis. In one example, the computing equipment manufacturer or administrator may install and/or insert the drawer into the slot of the storage server chassis and/or JBOD. In this example, upon installation and/or insertion of the drawer into the slot, a user (e.g., the computing equipment manufacturer or administrator) may open the drawer to service, remove, and/or replace one or more of the hard disk drives. Upon completion of such service, removal, and/or replacement, the user may close the drawer to return the set of hard disk drives to normal operation within the storage server chassis and/or JBOD.

In this configuration, the extensible airduct may, at step 830(A), stretch out to lengthen the distance between the hard disk drives and the fan module when the drawer is opened from the storage service chassis and/or JBOD. Conversely, in this configuration, the extensible airduct may, at step 830(B), contract to shorten the distance between the hard disk drives and the fan module when the drawer is closed in the storage service chassis and/or JBOD.

As explained above in connection with FIGS. 1-8, one or more systems or apparatuses may be able to improve the performance of hardware components undergoing service in open chassis drawers. For example, an extensible airduct may be incorporated between a fan module and one or more hard disk drives mounted to a drawer of a chassis (e.g., a storage server and/or JBOD). In this example, the extensible airduct may stretch out as the drawer is opened, thereby lengthening the distance between the hard disk drives and the fan module. This increase in the distance between the hard disk drives and the fan module may be able to greatly reduce and/or mitigate the level of acoustic vibrations that reach the hard disk drives from the fan module when the drawer is opened for service. In addition, the extensible airduct may support and/or facilitate this increase in distance without sacrificing and/or negatively impacting the storage density and/or TCO wins of the HDD-based solution.

EXAMPLE EMBODIMENTS

Example 1

A system includes (1) at least one hardware component mounted to a drawer of a chassis, (2) a fan module capable of generating airflow to cool the hardware component, and (3) an extensible airduct coupled between the hardware component and the fan module such that, when the drawer of the chassis is opened, the extensible airduct stretches out to lengthen a distance between the hardware component and the fan module and, when the drawer of the chassis is closed, the extensible airduct contracts to shorten the distance between the hardware component and the fan module.

Example 2

The system of Example 1, wherein a spring that (1) is coupled between the hardware component and the fan module and (2) applies a force that causes the extensible airduct to stretch out as the drawer is opened.

Example 3

The system of Example 1 or 2, wherein the spring resides within the extensible airduct.

Example 4

The system of any of Examples 1-3, further comprising (1) a first bracket coupled between the hardware component and the extensible airduct, and (2) a second bracket coupled between the fan module and the extensible airduct, wherein the spring is attached to both the first bracket and the second bracket such that the spring applies the force that stretches out the extensible airduct as the drawer is opened.

Example 5

The system of any of Examples 1-4, wherein the first bracket and the second bracket make contact with one another to limit the contraction of the extensible airduct as the drawer is closed.

Example 6

The system of any of Examples 1-5, further comprising a roller mechanism coupled to the fan module, wherein the roller mechanism enables the fan module to roll across a slot of the chassis that houses the drawer to which the hardware component is mounted as the drawer is opened.

Example 7

The system of any of Examples 1-6, further comprising a stop bracket coupled to the fan module, wherein the stop bracket facilitates stopping the fan module within the slot of the chassis as the drawer is opened.

Example 8

The system of any of Examples 1-7, further comprising a cable track that serves as a flexible conduit for one or more electrical wires, wherein the cable track resides between the extensible airduct and a surface of a slot of the chassis that houses the drawer to which the hardware component is mounted.

Example 9

The system of any of Examples 1-8, further comprising at least one linkage that supports the stretching out of the extensible airduct as the drawer is opened.

Example 10

The system of any of Examples 1-9, wherein the fan module generates airflow that (1) pulls heat emitted by the hardware component through the extensible airduct when the drawer is opened and (2) cools the hardware component.

Example 11

The system of any of Examples 1-10, wherein the airflow generated by the fan module (1) increases as the drawer is opened and (2) decreases as the drawer is closed.

Example 12

The system of any of Examples 1-11, wherein the hardware component comprises at least one hard disk drive.

Example 13

An apparatus comprising (1) a fan module capable of generating airflow to cool a hardware component mounted to a drawer of a chassis, (2) an extensible airduct coupled between the hardware component and the fan module such that, when the drawer of the chassis is opened, the extensible airduct stretches out to lengthen a distance between the hardware component and the fan module and, when the drawer of the chassis is closed, the extensible airduct contracts to shorten the distance between the hardware component and the fan module.

Example 14

The apparatus of Example 13, further comprising a spring that (1) is coupled between the hardware component and the fan module and (2) applies a force that causes the extensible airduct to stretch out as the drawer is opened.

Example 15

The apparatus of Example 13 or 14, wherein the spring resides within the extensible airduct.

Example 16

The apparatus of any of Examples 13-15, further comprising (1) a first bracket coupled between the hardware component and the extensible airduct, and (2) a second bracket coupled between the fan module and the extensible airduct, wherein the spring is attached to both the first bracket and the second bracket such that the spring applies the force that stretches out the extensible airduct as the drawer is opened.

Example 17

The apparatus of any of Examples 13-16, wherein the first bracket and the second bracket make contact with one another to limit the contraction of the extensible airduct as the drawer is closed.

Example 18

The apparatus of any of Examples 13-17, further comprising a roller mechanism coupled to the fan module, wherein the roller mechanism enables the fan module to roll across a slot of the chassis that houses the drawer to which the hardware component is mounted as the drawer is opened.

Example 19

The apparatus of any of Examples 13-18, further comprising a stop bracket coupled to the fan module, wherein the stop bracket facilitates stopping the fan module within the slot of the chassis as the drawer is opened.

Example 20

A method includes (1) mounting at least one hardware component to a drawer, (2) coupling an extensible airduct between the hardware component and a fan module capable of generating airflow to cool the hardware component mounted to the drawer, (3) installing the drawer into a chassis such that, when the drawer is opened relative to the chassis, the extensible airduct stretches out to lengthen a distance between the hardware component and the fan module and, when the drawer of the chassis is closed relative to the chassis, the extensible airduct contracts to shorten the distance between the hardware component and the fan module.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A system comprising:
   at least one hardware component mounted to a drawer of a chassis;
   a fan module capable of generating airflow to cool the hardware component; and
   an extensible airduct coupled between the hardware component and the fan module such that:
      when the drawer of the chassis is opened, the extensible airduct stretches out to lengthen a distance between the hardware component and the fan module; and
      when the drawer of the chassis is closed, the extensible airduct contracts to shorten the distance between the hardware component and the fan module.

2. The system of claim 1, further comprising a spring that:
   is coupled between the hardware component and the fan module; and
   applies a force that causes the extensible airduct to stretch out as the drawer is opened.

3. The system of claim 2, wherein the spring resides within the extensible airduct.

4. The system of claim 2, further comprising:
   a first bracket coupled between the hardware component and the extensible airduct; and
   a second bracket coupled between the fan module and the extensible airduct, wherein the spring is attached to both the first bracket and the second bracket such that the spring applies the force that stretches out the extensible airduct as the drawer is opened.

5. The system of claim 4, wherein the first bracket and the second bracket make contact with one another to limit the contraction of the extensible airduct as the drawer is closed.

6. The system of claim 1, further comprising a roller mechanism coupled to the fan module, wherein the roller mechanism enables the fan module to roll across a slot of the chassis that houses the drawer to which the hardware component is mounted as the drawer is opened.

7. The system of claim 6, further comprising a stop bracket coupled to the fan module, wherein the stop bracket facilitates stopping the fan module within the slot of the chassis as the drawer is closed.

8. The system of claim 1, further comprising a cable track that serves as a flexible conduit for one or more electrical wires, wherein the cable track resides between the extensible airduct and a surface of a slot of the chassis that houses the drawer to which the hardware component is mounted.

9. The system of claim 1, further comprising at least one linkage that supports the stretching out of the extensible airduct as the drawer is opened.

10. The system of claim 1, wherein the fan module generates airflow that:
    pulls heat emitted by the hardware component through the extensible airduct when the drawer is opened; and
    cools the hardware component.

11. The system of claim 10, wherein the airflow generated by the fan module:
    increases as the drawer is opened; and
    decreases as the drawer is closed.

12. The system of claim 1, wherein the hardware component comprises at least one hard disk drive.

13. An apparatus comprising:
    a fan module capable of generating airflow to cool a hardware component mounted to a drawer of a chassis; and
    an extensible airduct coupled between the hardware component and the fan module such that:
       when the drawer of the chassis is opened, the extensible airduct stretches out to lengthen a distance between the hardware component and the fan module; and
       when the drawer of the chassis is closed, the extensible airduct contracts to shorten the distance between the hardware component and the fan module.

14. The apparatus of claim 13, further comprising a spring that:
    is coupled between the hardware component and the fan module; and
    applies a force that causes the extensible airduct to stretch out as the drawer is opened.

15. The apparatus of claim 14, wherein the spring resides within the extensible airduct.

16. The apparatus of claim 14, further comprising:
    a first bracket coupled between the hardware component and the extensible airduct; and
    a second bracket coupled between the fan module and the extensible airduct, wherein the spring is attached to both the first bracket and the second bracket such that the spring applies the force that stretches out the extensible airduct as the drawer is opened.

17. The apparatus of claim 16, wherein the first bracket and the second bracket make contact with one another to limit the contraction of the extensible airduct as the drawer is closed.

18. The apparatus of claim 13, further comprising a roller mechanism coupled to the fan module, wherein the roller mechanism enables the fan module to roll across a slot of the chassis that houses the drawer to which the hardware component is mounted as the drawer is opened.

19. The apparatus of claim 18, further comprising a stop bracket coupled to the fan module, wherein the stop bracket facilitates stopping the fan module within the slot of the chassis as the drawer is closed.

20. A method comprising:
    mounting at least one hardware component to a drawer;
    coupling an extensible airduct between the hardware component and a fan module capable of generating airflow to cool the hardware component mounted to the drawer;
    installing the drawer into a chassis such that:
       when the drawer is opened relative to the chassis, the extensible airduct stretches out to lengthen a distance between the hardware component and the fan module; and
       when the drawer of the chassis is closed relative to the chassis, the extensible airduct contracts to shorten the distance between the hardware component and the fan module.

* * * * *